United States Patent
Handa et al.

(10) Patent No.: US 10,361,668 B2
(45) Date of Patent: Jul. 23, 2019

(54) DIFFERENTIAL CURRENT TO VOLTAGE CONVERTER

(71) Applicant: Analog Devices, Inc., Norwood, MA (US)

(72) Inventors: Yukihisa Handa, Arlington, MA (US); Nathan R. Carter, Arroyo Grande, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/336,091

(22) Filed: Oct. 27, 2016

(65) Prior Publication Data

US 2018/0123535 A1     May 3, 2018

(51) Int. Cl.
H03F 3/45 (2006.01)

(52) U.S. Cl.
CPC ....... *H03F 3/4508* (2013.01); *H03F 3/45475* (2013.01); *H03F 2200/555* (2013.01); *H03F 2203/45116* (2013.01); *H03F 2203/45151* (2013.01); *H03F 2203/45202* (2013.01)

(58) Field of Classification Search
CPC ............. H03F 3/45479; H03F 3/45928; H03F 3/45475; H03F 2203/45544; H03F 2203/45512; H03F 2200/261; G01P 15/0802; G01P 15/125
USPC .................................................. 330/258, 260
See application file for complete search history.

(56) References Cited

U.S. PATENT DOCUMENTS

| | | | |
|---|---|---|---|
| 4,616,189 A | 10/1986 | Pengue, Jr. | |
| 5,963,156 A | 10/1999 | Lewicki et al. | |
| 6,696,890 B2 | 2/2004 | Hedberg et al. | |
| 6,998,917 B2 | 2/2006 | Kudo et al. | |
| 7,071,780 B2 * | 7/2006 | Van Zanten | H03F 1/086 330/258 |
| 9,531,337 B2 * | 12/2016 | Chen | H03F 3/45479 |

* cited by examiner

*Primary Examiner* — Khanh V Nguyen
*Assistant Examiner* — Khiem Nguyen
(74) *Attorney, Agent, or Firm* — Schwegman Lundberg & Woessner, P.A.

(57) ABSTRACT

The present disclosure provides systems and methods to provide a constant common mode voltage at the input terminals of a difference amplifier. A difference amplifier can receive an input signal and can deliver an amplified version of the received input signal at an output of the difference amplifier. In a system where a difference amplifier can receive an output of a digital-to-analog converter (DAC), the DAC performance can deteriorate in situations where common mode voltage at the input terminals of the difference amplifier are changing. A difference amplifier including feedback circuitry can provide a constant common mode voltage at the input terminals of the difference amplifier, leading to improved performance in a system where the difference amplifier receives an input signal from a DAC.

26 Claims, 4 Drawing Sheets

DIFFERENTIAL CURRENT TO VOLTAGE CONVERTER

TECHNICAL FIELD

The present disclosure relates to systems and methods for providing a constant common mode voltage at the input terminals of a difference amplifier, such as to provide improved performance.

BACKGROUND

Difference amplifiers are used in a wide variety of applications including wireless communications, audio equipment, digital signal processing, and the control of motors. Difference amplifiers amplify differential mode input signals, while attenuating common mode input signals. In a system where a difference amplifier receives the output of a digital-to-analog converter (DAC), the DAC can be optimized to output a differential mode signal and the DAC performance can deteriorate in situations where the DAC additionally supplies a common mode signal to the difference amplifier. For example, when a DAC supplies a common mode signal to the difference amplifier, unwanted signal dependent distortions or nonlinearities can be introduced at the output of the DAC.

SUMMARY OF THE DISCLOSURE

The present inventors have recognized, among other things, the need to regulate the common mode voltage present at the input terminals of a difference amplifier to provide improved performance, such as in a system where the difference amplifier is receiving the output of a DAC. In certain systems, where a difference amplifier is receiving the output of a DAC, the DAC can be designed to provide an output to a difference amplifier having a certain common mode voltage. During operation of the DAC and the difference amplifier, the common mode voltage present at the input terminals of the difference amplifier can change. In certain systems, the DAC can provide a common mode voltage, such as to compensate for changes in the common mode voltage at the input terminals of the difference amplifier. An output voltage, such as that provided by the DAC can suffer from signal dependent distortions or non-linearity as a result of the common mode voltage, such as that provided by the DAC to compensate for the changes in the common mode voltage at the input terminals of the difference amplifier.

The present disclosure can provide, among other things, feedback circuitry for providing a constant common mode voltage at the input terminals of a difference amplifier, such as to improve performance in a system where the difference amplifier receives an input voltage signal from a DAC.

In an aspect, the disclosure can feature a method for maintaining a constant common mode voltage at an input of a difference amplifier being driven by a digital-to-analog converter, the difference amplifier having positive and negative input terminals and an output terminal. The method can include receiving an electrical signal having a common mode component and a differential mode component from the output of a digital-to-analog converter, such as for being provided to the difference amplifier. The method can also include providing the electrical signal present at one of the positive terminal of the difference amplifier or the output terminal of the difference amplifier, such as to a first input of a feedback amplifier for comparison to a reference voltage provided to a second input of the feedback amplifier, the feedback amplifier including an output terminal controlling common mode biasing feedback currents for respectively biasing the positive and negative terminals of the difference amplifier. The method can also include delivering the feedback currents respectively to the positive and negative input terminals of the difference amplifier, the feedback currents causing the common mode voltage at the positive and negative inputs of the difference amplifier to remain constant. The method can also include delivering a voltage from the output of the feedback amplifier to a pair of transistors, the transistors respectively delivering the feedback currents to the positive and negative input terminals of the difference amplifier. The step of providing the electrical signal can include providing the electrical signal present at the positive terminal of the difference amplifier to the first input of the feedback amplifier without providing the electrical signal present at the output terminal of the difference amplifier to the first input of the feedback amplifier. The feedback current can cause the common mode voltage at the input of the difference amplifier to remain constant for a received electrical signal having a differential mode component or a common mode component. The step of providing the electrical signal can include providing the electrical signal present at the output terminal of the difference amplifier to the first input of the feedback amplifier without providing the electrical signal present at the positive terminal of the difference amplifier to the first input of the feedback amplifier. The feedback current can cause the common mode voltage at the input of the difference amplifier to remain constant for a received electrical signal having a differential mode component. The method can also include delivering a voltage from the output of the feedback amplifier to a pair of resistors, each resistor being selected such that the current noise introduced by the feedback amplifier can be less than the electrical noise associated with the difference amplifier.

In an aspect, the disclosure can feature a method for maintaining a constant common mode voltage at an input of a difference amplifier. The method can include receiving an electrical signal, such as for being provided to the difference amplifier. The method can also include providing an electrical signal present at a terminal of the difference amplifier, such as to a first input of the feedback amplifier for comparison to a reference voltage provided to a second input of the feedback amplifier. The method can also include delivering a feedback current to the difference amplifier, the feedback current helping the common mode voltage at the input of the difference amplifier to remain constant. The method can also include delivering a voltage from an output of the feedback amplifier to a pair of transistors, the transistors delivering the feedback current to the difference amplifier. The terminal of the difference amplifier can be a positive input terminal. The feedback current can cause the common mode voltage at the input of the difference amplifier to remain constant for a received electrical signal having a differential mode component or a common mode component. The terminal of the difference amplifier can be an output terminal. The feedback current can cause the common mode voltage at the input of the difference amplifier to remain constant for a received electrical signal having a differential mode component. The method can also include delivering a voltage from the output of the feedback amplifier to a pair of resistors, each resistor being selected such that the current noise introduced by the feedback amplifier can be less than the electrical noise associated with the difference amplifier.

In an aspect, the disclosure can feature a system for maintaining a constant common mode voltage at an input of a difference amplifier being driven by a digital-to-analog converter. The system can include a difference amplifier having positive and negative input terminals and an output terminal, the difference amplifier can be configured to receive an electrical signal having a common mode component and a differential mode component from the output of a digital-to-analog converter. The system can also include a feedback amplifier configured to receive a reference voltage signal at a first input and a feedback signal from the difference amplifier at a second input, the feedback amplifier can be further configured to deliver feedback currents respectively to the positive and negative input terminals of the difference amplifier, the feedback currents can cause the common mode voltage at the positive and negative inputs of the difference amplifier to remain constant. The second input of the feedback amplifier can be electrically coupled to the positive terminal of the difference amplifier. The feedback currents can cause the common mode voltage at the input terminals of the difference amplifier to remain constant for a received electrical signal having a common mode component or a differential mode component. The second input of the feedback amplifier can be electrically coupled to the output terminal of the difference amplifier. The feedback currents can cause the common mode voltage at the input terminals of the difference amplifier to remain constant for a received electrical signal having a differential mode component. The system can also include a pair of transistors, the pair of transistors configured to receive an output from the feedback amplifier and deliver feedback currents respectively to the positive and negative input terminals of the difference amplifier. The system can also include a pair of resistors electrically coupled to the output of the feedback amplifier and respectively to the positive and negative input terminals of the difference amplifier, each resistor being selected such that the current noise introduced by the feedback amplifier can be less than the electrical noise associated with the difference amplifier.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A difference amplifier can receive an input signal and can deliver an amplified version of the received input signal, such as at an output of the difference amplifier (e.g., an input signal of 0.1 V can be amplified to 1V). In a system where a difference amplifier can receive an output of a digital-to-analog converter (DAC), the DAC can be optimized, such as to output a differential mode signal and the DAC performance can deteriorate in situations where the DAC additionally supplies a common mode signal, such as to the difference amplifier. For example, when a DAC supplies a common mode signal, such as to the difference amplifier, unwanted signal dependent distortions or nonlinearities can be introduced, such as at the output of the DAC.

Figure 1:
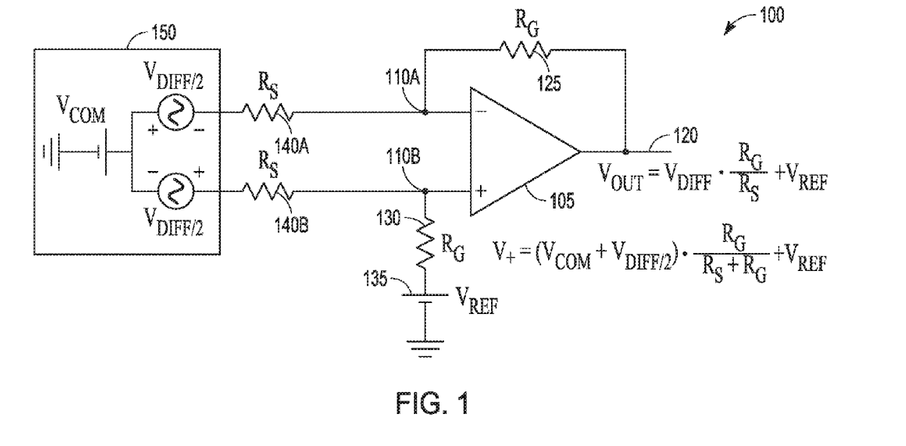
FIG. 1 illustrates a diagram of a difference amplifier circuit.

FIG. 1 shows an example of a difference amplifier circuit 100. The difference amplifier circuit can include a difference amplifier 105, a feedback resistor 125, an offset resistor 130, a reference voltage source 135, resistors 140a, 140b, and a voltage source 150. The difference amplifier 105 can include inputs 110, including positive input terminal 110b, a negative input terminal 110a, and an output terminal 120. The positive input terminal 110b can be a non-inverting terminal and the negative input terminal 110a can be an inverting terminal. An increased signal voltage at the non-inverting terminal relative to the inverting terminal can cause the voltage at an output terminal to increase (e.g., the output terminal 120). An increased signal voltage at the inverting terminal relative to the non-inverting terminal can cause the voltage at an output terminal to decrease (e.g., the output terminal 120). The feedback resistor 125 can provide a connection between the negative input terminal 110a and the output 120 terminal. The reference voltage source 135 can be connected to ground, and to the offset resistor 130. The offset resistor 130 can provide a connection between the positive input terminal 110b and the reference voltage source 135. The resistors 140 can provide a connection between voltage source 150 and the input terminals 110a, 110b. During operation, the voltage source 150 can apply a differential voltage having a value of $V_{diff}/2$ and a common mode voltage having a value of $V_{com}$ to the resistors 140, the reference voltage source 135 can provide a voltage of $V_{ref}$ to the offset resistor 130, and the voltage at the output 120 of the difference amplifier 105 can be independent of the common mode voltage $V_{com}$ provided by the voltage source 150 and can be expressed as follows:

$$V_{out} = V_{diff} * R_G/R_S + V_{ref}$$

A voltage at the positive input terminal 110b can be expressed as follows:

$$V_+ = \left(\frac{V_{diff}}{2} + V_{com}\right) * \frac{R_G}{R_S + R_G} + V_{ref} * \frac{R_S}{R_S + R_G}$$

where $V_+$ can represent a voltage at the positive input terminal 110b, $V_{diff}$ can represent a differential mode voltage supplied by the voltage source 150, $V_{com}$ can represent a common mode voltage supplied by the voltage source 150, $R_S$ can represent the resistance of one of the resistors 140a, 140b, $R_G$ can represent the resistance of the feedback resistor 125, and $V_{ref}$ can represent a reference voltage supplied by the reference voltage source 135. The difference amplifier 105 can adjust an output voltage 120 such as can cause the voltage at the negative input 110a to be equal to the voltage at the positive input 110b. Thus, the voltage at the positive input 110b can determine the voltage at the negative input 110a. In an example, such as that shown in FIG. 1, the voltage at the input terminals 110 can vary with a differential mode voltage, a common mode voltage, and a reference voltage. In an example, the voltage source 150, and the resistors 140*a*, 140*b* can be part of a digital-to-analog converter (DAC), such as a delta-sigma DAC, a SAR capacitive DAC, or a current output DAC. During operation, the DAC can provide a differential mode voltage, such as that supplied by the voltage source 150, such as to be amplified by the difference amplifier circuit 105. The differential mode voltage can cause the common mode voltage at the input terminals 110 to change and in response to the changing common mode voltage at the input terminals 110, the DAC can provide a common mode voltage, such as that supplied by voltage source 150 to the inputs 110 of the difference amplifier 105. In such a system in which a DAC provides a common mode voltage to the input terminals 110 of the difference amplifier, the DAC output can suffer from signal dependent distortions and non-linearity.

Figure 2:
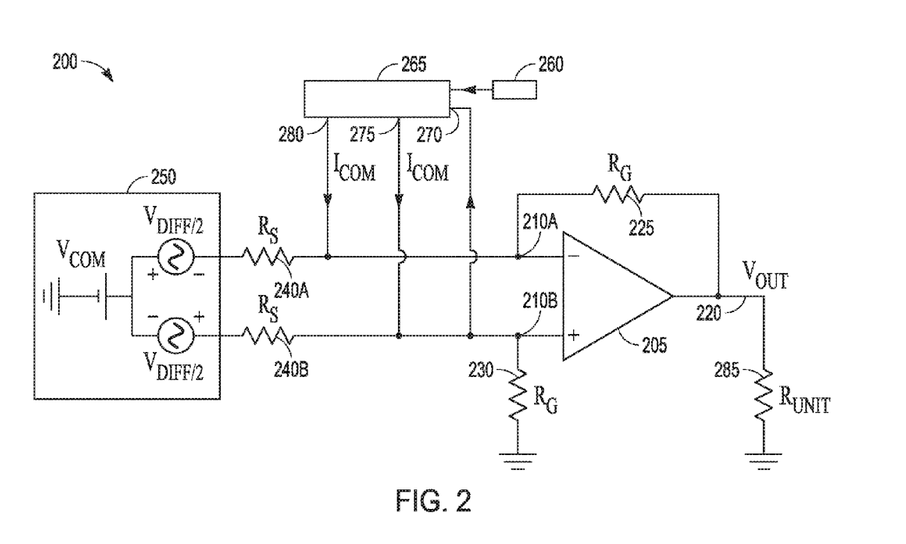
FIG. 2 illustrates a diagram of a difference amplifier circuit.

FIG. 2 shows an example of a difference amplifier and biasing network 200, such as for providing a constant common mode voltage at the inputs of a difference amplifier circuit 205. The difference amplifier and biasing network 200 can include a difference amplifier circuit 205, a feedback resistor 225, an offset resistor 230, resistors 240*a*, 240*b*, an output resistor 285, and a feedback circuit 265. The feedback circuit 265 can include a first input 260, a second input 270, a first output 275, and a second output 280. The difference amplifier circuit 205 can include input terminals 210, including a positive input terminal 210*b*, a negative input terminal 210*a*, and an output terminal 220. The positive input terminal 210*b* can be a non-inverting terminal and the negative input terminal 210*a* can be an inverting terminal. An increased signal voltage at the non-inverting terminal relative to the inverting terminal can cause the voltage at an output terminal to increase (e.g., the output terminal 220). An increased signal voltage at the inverting terminal relative to the non-inverting terminal can cause the voltage at an output terminal to decrease (e.g., the output terminal 220). The offset resistor 230 can provide a connection between the positive input terminal 210*b* and electrical ground. The resistors 240 can provide a connection from a voltage source 250 to the input terminals 210*a* and 210*b*. In an example, the resistors 240 and the voltage source 250 can be part of a DAC, such as a delta-sigma DAC or a current output DAC. The first output 275 can be connected to the positive input terminal 210*b* and the second output 280 can be connected to the negative input terminal 210*a*. The first input 260 can be connected to a voltage reference and the second input 270 can be connected to a positive input terminal 210*b*. The output terminal 220 of the difference amplifier circuit 205 can be connected to electrical ground via an output resistor 285. During operation, a common mode voltage, such as that supplied by the voltage source 250 and a differential mode voltage, such as that supplied by the voltage source 250 can be applied to the input terminals 210*a* and 210*b* via the resistors 240*a* and 240*b*. The common mode voltage and the differential mode voltage can change with time and can cause a common mode voltage at the input terminals 210*a* and 210*b* to change with time in the absence of feedback circuitry, such as feedback circuitry 265. The feedback circuitry 265 can maintain a constant common mode voltage at the input terminals 210*a* and 210*b* for an applied common mode voltage and an applied differential mode voltage. In an example, the common mode feedback loop, including feedback circuitry 265 and the difference amplifier 205 can provide a common mode signal such that the common mode voltage at the input terminals can be held constant within a fraction inversely proportional to the loop gain of the feedback loop (e.g. for a loop gain of 100, the common mode voltage can be held constant within 1%, depending on the matching of components such as resistors). A reference voltage can be provided to the first input 260 of the feedback circuit 265 and the second input 270 of the feedback circuit can sense a voltage at the positive input terminal 210*b*. In an example, the feedback circuitry 265 can have an input impedance at the second input 270 that is large enough to not interfere with the signal path at node 210*b*. The feedback circuit 265 can provide a current to the positive terminal 210*a* and the negative terminal 210*b* via the first and second outputs 275 and 280, respectively, such as to cause the voltage at the positive input terminal 210*b* to be the same as a reference voltage, such as that provided to the first input 260. The feedback circuit 265 can thus maintain a constant voltage at the positive input terminal 210*b*. The difference amplifier circuit 205 can provide a voltage at output terminal 220 such that the voltage at the negative input terminal 210*a* is equal to the voltage at the positive input terminal 210*b*. Thus, during operation of the difference amplifier and biasing network 200, a common mode voltage at the input terminals 210 of the difference amplifier circuit 205 can be maintained at a voltage determined by a reference voltage, such as that provided to the first input 260 of the feedback circuit 265. For example, the reference voltage can be a constant value in the range of −5V to 5V. The common mode voltage can be maintained at the input terminals 210 for applied differential mode voltages and applied common mode voltages. In such an example, where a DAC can provide the differential mode voltage and the common mode voltage to the input terminals 210, the reference voltage can be selected such as to optimize operation of the DAC, such as to avoid signal dependent distortions and non-linearity. The DAC can include filter capacitors connected from positive input terminal 210*b* to electrical ground, such as to stabilize the feedback loop.

Figure 2A:
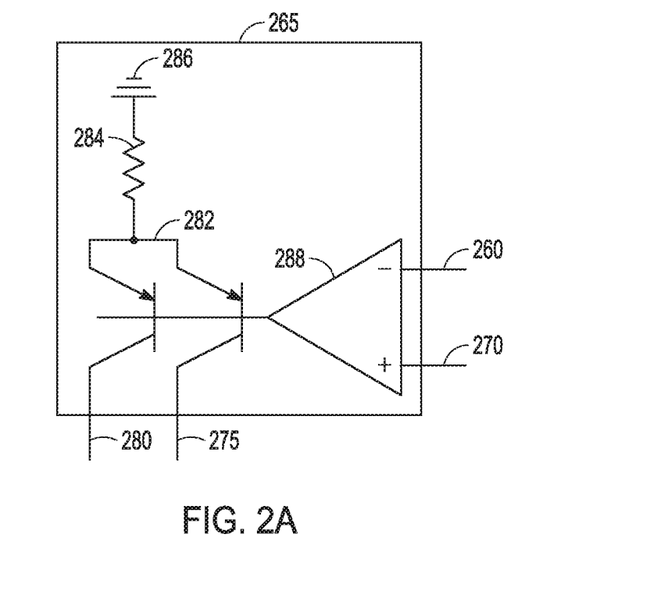
FIGS. 2A, 2B illustrate diagrams of feedback circuitry.

FIG. 2A shows an example of feedback circuitry 265. Feedback circuitry 265 can include a first input 260, a second input 270, a first output 275, a second output 280, a pair of bipolar or other transistors 282, a biasing resistor 284, a voltage source 286, and a difference amplifier circuit 288. The first input 260 can be connected to a negative terminal of the difference amplifier circuit 288, the second input can be connected to a positive terminal of the difference amplifier circuit 288, the first output 275 can be connected to a collector of one of the pair of transistors 282, the second output 280 can be connected to a collector of the other one of the pair of transistors 282, and the output terminal of the difference amplifier circuit 288 can be connected to the bases of the transistors 282. During operation, a reference voltage can be provided to the first input 260 and a voltage at the positive input terminal 210*b* of the difference amplifier circuit 205 can be provided to the second input terminal 270. The difference amplifier circuit 288 can provide an output voltage to the bases of the transistors 282 such as to cause a current to flow from output terminals 280 and 275, such as to the input terminals 210, such as to maintain the voltage at the positive terminal 210*b* at the same value as the reference voltage applied to the first input 260. In an example, the feedback circuitry 265 can have an input impedance at the second input 270 that is large enough to not interfere with the signal path at node 210*b*. In an example, such as that shown in FIG. 2B, the noise introduced by the feedback circuitry 265 having one difference amplifier 288 can be smaller by a square root of two compared with systems that include two transimpedance amplifiers used to maintain a constant common mode input level.

Figure 2B:
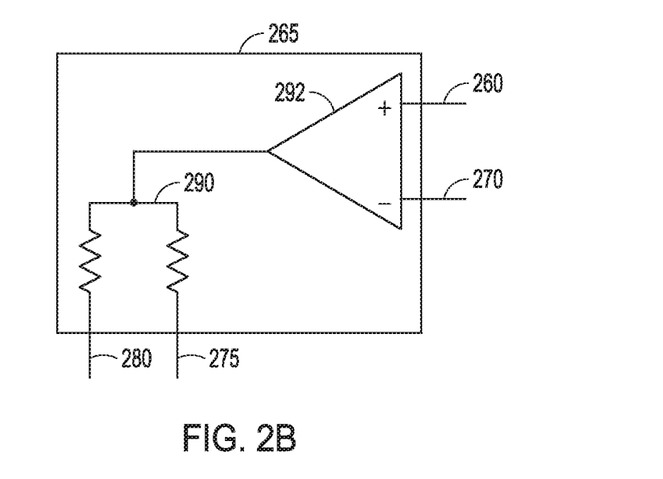

FIG. 2B shows an example of feedback circuitry 265. Feedback circuitry 265 can include a first input 260, a second input 270, a first output 275, a second output 280, a pair of resistors 290, and a difference amplifier circuit 292. The first input 260 can be connected to a positive terminal of the difference amplifier circuit 292, the second input 270 can be connected to a negative terminal of the difference amplifier circuit 292, the first output 275 can be connected to one of the pair of resistors 290, the second output 280 can be connected to the other one of the pair of resistors 290, and the output terminal of the difference amplifier 292 circuit can be connected to the resistors 290. During operation, a reference voltage can be provided to the first input 260 and a voltage at the positive input terminal 210b of the difference amplifier circuit 205 can be provided to the second input terminal 270. The difference amplifier circuit 292 can provide an output voltage to the resistors 290 such as to cause a current to flow from output terminals 280 and 275 to the input terminals 210, such as to maintain the voltage at the positive terminal 210b at the same value as the reference voltage applied to the first input 260. In an example, the feedback circuitry 265 can have an input impedance at the second input 270 that is large enough to not interfere with the signal path at node 210b.

Figure 3:
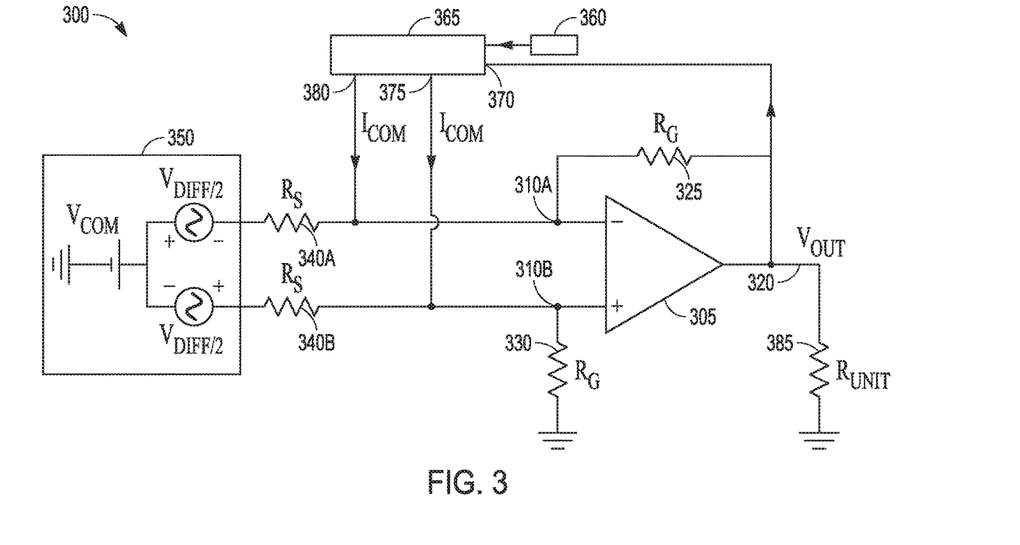
FIG. 3 illustrates a diagram of a difference amplifier circuit.

FIG. 3 shows an example of a difference amplifier and biasing network 300, such as for providing a constant common mode voltage at the inputs of a difference amplifier circuit 305. The difference amplifier and biasing network 300 can include a difference amplifier circuit 305, a feedback resistor 325, an offset resistor 330, resistors 340a, 340b, an output resistor 385, and a feedback circuit 365. The feedback circuit 365 can include a first input 360, a second input 370, a first output 375, and a second output 380. The difference amplifier circuit 305 can include input terminals 310, including a positive input terminal 310b, a negative input terminal 310a, and an output terminal 320. The positive input terminal 310b can be a non-inverting terminal and the negative input terminal 310a can be an inverting terminal. An increased signal voltage at the non-inverting terminal relative to the inverting terminal can cause the voltage at an output terminal to increase (e.g., the output terminal 320). An increased signal voltage at the inverting terminal relative to the non-inverting terminal can cause the voltage at an output terminal to decrease (e.g., the output terminal 320). The offset resistor 330 can provide a connection between the positive input terminal 310b and electrical ground. The resistors 340 can provide a connection from a voltage source 350 to the input terminals 310a and 310b. In an example, the resistors 340 and the voltage source 350 can be part of a DAC, such as a delta-sigma DAC, a SAR capacitive DAC, or a current output DAC. The first output 375 can be connected to the positive input terminal 310b and the second output 380 can be connected to the negative input terminal 310a. The first input 360 can be connected to a voltage reference and the second input 370 can be connected to an output terminal 320 of the difference amplifier circuit 305. The output terminal 320 of the difference amplifier circuit 305 can be connected to electrical ground via an output resistor 385. During operation, a common mode voltage, such as that supplied by the voltage source 350 and a differential mode voltage, such as that supplied by the voltage source 350 can be applied to the input terminals 310a and 310b via the resistors 340a and 340b. The common mode voltage and the differential mode voltage can change with time and can cause a common mode voltage at the input terminals 310a and 310b to change with time in the absence of feedback circuitry, such as feedback circuitry 365. The feedback circuitry 365 can maintain a constant common mode voltage at the input terminals 310a and 310b for an applied differential mode voltage. A reference voltage can be provided to the first input 360 of the feedback circuit 365 and the second input 370 of the feedback circuit can sense a voltage at the output terminal 320. The feedback circuit 365 can provide a current to the positive input terminal 310a and the negative input terminal 310b via the first and second outputs 375 and 380, respectively, such as to cause the voltage at the positive input terminal 310b to be the same as a reference voltage, such as that provided to the first input 360. The feedback circuit 365 can thus maintain a constant voltage at the positive input terminal 310b. The difference amplifier circuit 305 can provide a voltage at output terminal 320 such that the voltage at the negative input terminal 310a is equal to the voltage at the positive input terminal 310b. Thus, during operation of the difference amplifier and biasing network 300, a common mode voltage at the input terminals 310 of the difference amplifier circuit 305 can be maintained at a voltage determined by a reference voltage, such as that provided to the first input 360 of the feedback circuit 365. The common mode voltage can be maintained at the input terminals 310 for applied differential mode voltages, such as that provided by the voltage source 350. In such an example, where a DAC is providing the differential mode voltage to the input terminals 310, the reference voltage can be selected such as to optimize operation of the DAC and the DAC can avoid the need to provide a common mode voltage to maintain a constant common mode voltage at the inputs 310 of the difference amplifier circuit 305 and thus can avoid signal dependent distortions and non-linearity. In an example where a difference amplifier circuit, such as difference amplifier circuit 305 can receive the output of a digital-to-analog converter (DAC), the DAC can have a large output capacitance (e.g., the DAC can have an output capacitance of at least 10 pF) and additionally, filter capacitors can be connected from the positive input terminal 310b of the difference amplifier to an electrical ground. The filter capacitors can cause instabilities when the feedback circuitry can sense a voltage at the positive input terminal, such as shown in FIG. 2. In such an example, it can be advantageous to provide feedback circuitry that can provide a constant common mode voltage at the input of the difference amplifier circuit, such as based on an output signal of the difference amplifier circuit, such as to improve speed of operation of the feedback circuitry by avoiding a large capacitance, such as that associated with the DAC or the filter capacitors that can be connected from the positive input terminal 310b to an electrical ground. In an example, the difference amplifier 305 can be part of an integrated circuit and the resistors 325 and 330 can be external to the integrated circuit, such as to provide for improved thermal performance of the difference amplifier and biasing network 300.

Figure 3A:
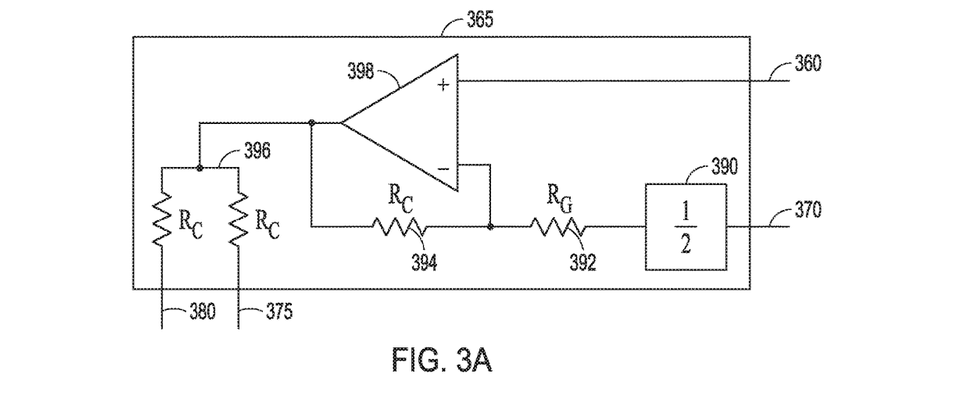
FIGS. 3A, 3B illustrate diagrams of feedback circuitry.

FIG. 3A shows an example of feedback circuitry 365. Feedback circuitry 365 can include a first input 360, a second input 370, a first output 375, a second output 380, a pair of resistors 396, a first feedback resistor 394, a second feedback resistor 392, a multiplier 390, and a difference amplifier circuit 398. The first input 360 can be connected to a positive terminal of the difference amplifier circuit 398, the second input 370 can be connected to the multiplier 390, the multiplier can be connected to the second feedback resistor 392, the second feedback resistor 392 can be connected to a negative input terminal of the difference amplifier circuit 398 and to the first feedback resistor 394, the first feedback resistor 394 can be connected to the output of the difference amplifier circuit 398 and to the pair of resistors 396, the first output 375 can be connected to one of the pair of resistors 396, the second output 380 can be connected to other one of the pair of resistors 396. During operation, a reference voltage can be provided to the first input 360 and a voltage at the output terminal 320 of the difference amplifier circuit 305 can be provided to the second input terminal 370. The difference amplifier circuit 398 can provide an output voltage to the pair of resistors 396 such as to cause a current to flow from output terminals 280 and 275, such as to the input terminals 310, such as to maintain a voltage at the positive terminal 310b at the same value as the reference voltage applied to the first input 360. In an example, the reference voltage applied to the first input 360 can have a value of $V_{com}$, and the voltage at the outputs 375 and 380 of the feedback circuit 365 can be represented by the following expression:

$$V_{com} * \left(1 + \frac{R_C}{R_G}\right) - V_{diff} * \frac{R_C}{2 + R_S}$$

where $V_{com}$ can be the reference voltage applied to the first input 360 of the feedback circuit 365, $R_C$ can be the value of one of the resistors 396 or 394 (e.g., resistors 394 and 396 can have the same value), $R_G$ can be a value of one of the resistor 325, 310, or 392 (e.g. resistors 325, 310, 392 can have the same value), $R_S$ can be the value of one of the resistors 340a or 340b (e.g., the resistors 340a and 340b can have the same value), and $V_{diff}$ can be the applied differential mode voltage, such as that supplied by the voltage source 350.

Figure 3B:
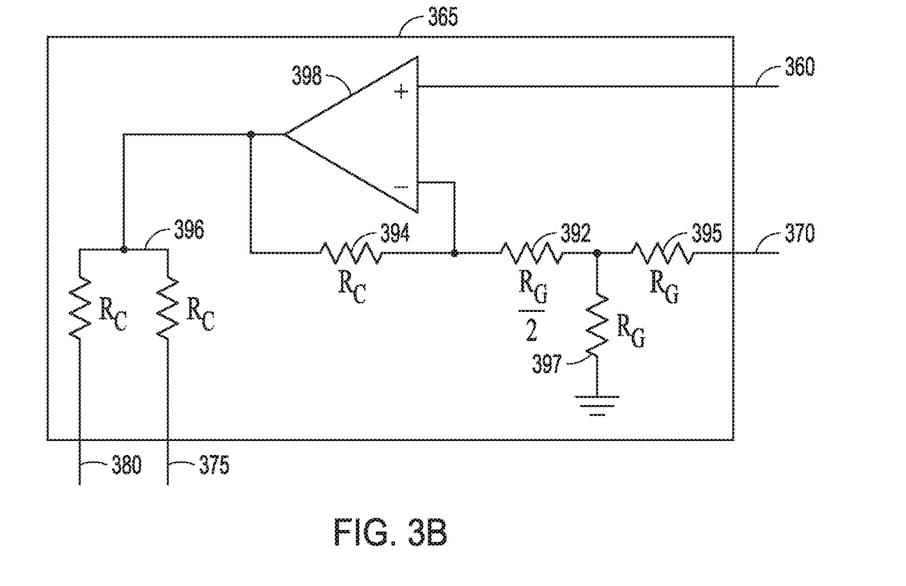

FIG. 3B shows an example of feedback circuitry 365. Feedback circuitry 365 can include a first input 360, a second input 370, a first output 375, a second output 380, a pair of resistors 396, a first feedback resistor 394, a second feedback resistor 392, a third feedback resistor 395, a fourth feedback resistor 397, and a difference amplifier circuit 398. The first input 360 can be connected to a positive terminal of the difference amplifier circuit 398, the second input 370 can be connected to the third feedback resistor 395, the third feedback resistor 395 can be connected to the second feedback resistor 292 and the fourth feedback resistor 397, the fourth feedback resistor 397 can be connected to an electrical ground, the second feedback resistor 292 can be connected to a negative input terminal of the difference amplifier circuit 398 and to the first feedback resistor 394, the first feedback resistor 394 can be connected to the output of the difference amplifier 398 circuit and to the pair of resistors 396, the first output 375 can be connected to one of the pair of resistors 396, and the second output 380 can be connected to other one of the pair of resistors 396. During operation, a reference voltage can be provided to the first input 360 and a voltage at the output terminal 320 of the difference amplifier circuit 305 can be provided to the second input terminal 370. The difference amplifier 398 circuit can provide an output voltage to the pair of resistors 396 such as to cause a current to flow from output terminals 280 and 275, such as to the input terminals 310, such as to maintain the voltage at the positive terminal 310b at the same value as the reference voltage applied to the first input 360. In an example, the reference voltage provide to the first input 360 can have a value of $V_{com}$, and the voltage at the outputs 375 and 380 of the feedback circuit 365 can be represented by the following expression:

$$V_{com} * \left(1 + \frac{R_C}{R_G}\right) - V_{diff} * \frac{R_C}{2 + R_S}$$

where $V_{com}$ can be the reference voltage applied to the first input 360 of the feedback circuit 365, $R_C$ can be the value of one of the resistors 396 or 394 (e.g., resistors 394 and 396 can have the same value), $R_G$ can be a value of one of the resistor 325, 310, 395, or 397 (e.g. resistors 325, 310, 395, and 397 can have the same value), $R_S$ can be the value of one of the resistors 340a or 340b (e.g., the resistors 340a and 340b can have the same value), and $V_{diff}$ can be an applied differential mode voltage, such as that supplied by the voltage source 350.

Figure 4:
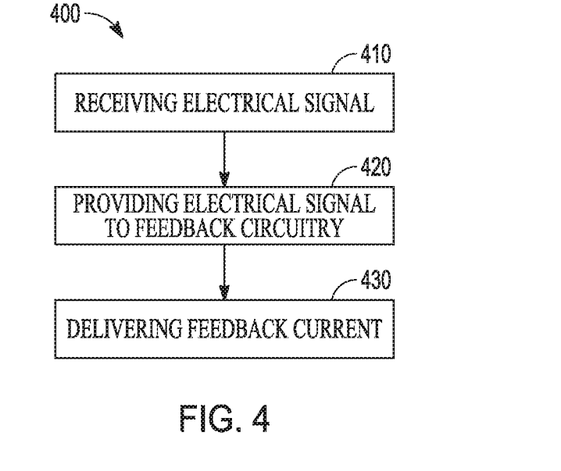
FIG. 4 illustrates a method of maintaining a common mode voltage at the input terminals of the difference amplifier.

FIG. 4 shows a method 400 of maintaining a common mode voltage at the input terminals of the difference amplifier. A difference amplifier (e.g., different amplifier circuit 205 or 305) can receive an electrical signal having a common mode component and a differential mode component (step 410). In an example, the difference amplifier can receive the electrical signal from the output of a digital-to-analog converter. The electrical signal present at one of the positive terminal of the difference amplifier or the output terminal of the difference amplifier can be provided to a first input of a feedback amplifier for comparison to a reference voltage provided to a second input of the feedback amplifier, the feedback amplifier including an output terminal controlling common mode biasing feedback currents for respectively biasing the positive and negative terminals of the difference amplifier (step 420). The feedback circuitry, such as feedback circuitry 265 or 365 can deliver feedback currents to the positive and negative input terminals of the difference amplifier to causing the common mode voltage at the positive and negative inputs of the difference amplifier to remain constant (step 430).

What is claimed is:

1. A method for maintaining constant common mode voltage at an input of a difference amplifier being driven by a digital-to-analog converter, the difference amplifier having positive and negative input terminals and an output terminal, the method comprising:
   receiving an electrical signal having a common mode component and a differential mode component from an output of the digital-to-analog converter for being provided to the difference amplifier; and
   providing the electrical signal present at a terminal of the difference amplifier to a first input of a feedback amplifier for comparison to a reference voltage provided to a second input of the feedback amplifier, the feedback amplifier including an output terminal controlling common mode biasing feedback currents for respectively biasing the positive and negative terminals of the difference amplifier to cause the common mode voltage at the positive and negative inputs of the difference amplifier to remain constant, wherein the terminal is one of the output terminal of the difference amplifier or the positive input terminal of the difference amplifier.

2. The method of claim 1 further comprising delivering a voltage from the output of the feedback amplifier to a pair of transistors, the transistors respectively delivering feedback currents to the positive and negative input terminals of the difference amplifier.

3. The method of claim 1 wherein the feedback current causes the common mode voltage at the input of the difference amplifier to remain constant for a received electrical signal having a differential mode component or a common mode component.

4. The method of claim 1 wherein the feedback current causes the common mode voltage at the input of the difference amplifier to remain constant for a received electrical signal having a differential mode component.

5. The method of claim 1 further comprising delivering a voltage from the output of the feedback amplifier to a pair of resistors, each resistor being selected such that a current noise introduced by the feedback amplifier is less than an electrical noise associated with the difference amplifier.

6. A method for maintaining a constant common mode voltage at an input of a difference amplifier, the method comprising:
   receiving an electrical signal for being provided to the difference amplifier;
   providing an electrical signal present at a terminal of the difference amplifier to a first input of a feedback amplifier for comparison to a reference voltage provided to a second input of the feedback amplifier;
   delivering a feedback current to the difference amplifier, the feedback current helping a common mode voltage at the input of the difference amplifier to remain constant; and
   delivering a voltage from an output of the feedback amplifier to a pair of transistors, the transistors delivering the feedback current to the difference amplifier.

7. The method of claim 6 wherein the feedback current causes the common mode voltage at the input of the difference amplifier to remain constant for a received electrical signal having a differential mode component or a common mode component.

8. The method of claim 6 wherein the feedback current causes the common mode voltage at the input of the difference amplifier to remain constant for a received electrical signal having a differential mode component.

9. The method of claim 6 further comprising delivering a voltage from the output of the feedback amplifier to a pair of resistors, each resistor being selected such that current noise introduced by the feedback amplifier is less than electrical noise associated with the difference amplifier.

10. A system for maintaining a constant common mode voltage at an input of a difference amplifier being driven by a digital-to-analog converter, the system comprising:
   the difference amplifier having positive and negative input terminals and an output terminal, the difference amplifier configured to receive an electrical signal having a common mode component and a differential mode component from an output of the digital-to-analog converter; and
   a feedback amplifier configured to receive a reference voltage signal at a first input and a feedback signal from a terminal of the difference amplifier at a second input, the feedback amplifier further configured to deliver feedback currents respectively to the positive and negative input terminals of the difference amplifier, the feedback currents causing the common mode voltage at the positive and negative inputs of the difference amplifier to remain constant, wherein the terminal is one of the output terminal of the difference amplifier or the positive input terminal of the difference amplifier.

11. The system of claim 10 wherein the feedback currents cause the common mode voltage at the input terminals of the difference amplifier to remain constant for a received electrical signal having a common mode component or a differential mode component.

12. The system of claim 10 wherein the feedback currents cause the common mode voltage at the input terminals of the difference amplifier to remain constant for a received electrical signal having a differential mode component.

13. The system of claim 10 further comprising a pair of transistors, the pair of transistors configured to receive an output from the feedback amplifier and deliver feedback currents respectively to the positive and negative input terminals of the difference amplifier.

14. The method of claim 4 wherein the feedback current causes the common mode voltage at the input of the difference amplifier to remain constant within a fraction inversely proportional to a loop gain of a feedback loop for a received electrical signal having a differential mode component.

15. The method of claim 14 wherein the feedback current causes the common mode voltage at the input of the difference amplifier to remain constant within 1%.

16. The method of claim 1 comprising selecting a value of the reference voltage to reduce signal dependent distortions or non-linearities in the digital-to-analog converter.

17. The method of claim 6 wherein the feedback current causes the common mode voltage at the input of the difference amplifier to remain constant within a fraction inversely proportional to a loop gain of a feedback loop for a received electrical signal having a differential mode component.

18. The method of claim 17 wherein the feedback current causes the common mode voltage at the input of the difference amplifier to remain constant within 1%.

19. The system of claim 10 wherein the feedback currents cause the common mode voltage at the positive and negative inputs of the difference amplifier to remain constant within a fraction inversely proportional to a loop gain of a feedback loop for a received electrical signal having a differential mode component.

20. The system of claim 17 wherein the feedback current causes the common mode voltage at the input of the difference amplifier to remain constant within 1%.

21. The method of claim 1, wherein the terminal is the output terminal of the difference amplifier.

22. The method of claim 1, wherein the terminal is the positive input terminal of the difference amplifier.

23. The method of claim 6, wherein the terminal is an output terminal of the difference amplifier.

24. The method of claim 6, wherein the terminal is a positive input terminal of the difference amplifier.

25. The system of claim 10, wherein the terminal is the output terminal of the difference amplifier.

26. The system of claim 10, wherein the terminal is the positive input terminal of the difference amplifier.

* * * * *